United States Patent [19]

Craft

[11] 3,914,704

[45] Oct. 21, 1975

[54] FEEDBACK AMPLIFIER

[75] Inventor: Jack Craft, Somerville, N.J.

[73] Assignee: RCA Corporation, New York, N.Y.

[22] Filed: May 17, 1974

[21] Appl. No.: 470,758

[30] Foreign Application Priority Data

Aug. 13, 1973 United Kingdom.............. 38320/73

[52] U.S. Cl. .................. 330/18; 330/28; 330/30 D

[51] Int. Cl.[2] ........................................... H03F 3/42

[58] Field of Search........... 330/18, 28, 30 D, 38 M, 330/69

[56] References Cited

UNITED STATES PATENTS

| | | | |
|---|---|---|---|
| 3,434,069 | 3/1969 | Jones | 330/30 D |
| 3,622,903 | 11/1971 | Steckler | 330/30 D |

OTHER PUBLICATIONS

Krabbe, "Using A Monolithic Instrumentation Amplifier." *Electronic Engineering*, Oct. 1972, pp. 22, 23.

Liu, "Differential Variable-Gain Amplifier," *IBM Technical Disclosure Bulletin*, Vol. 15, No. 5 Oct. 1972 p. 1444.

*Primary Examiner*—James B. Mullins
*Attorney, Agent, or Firm*—Eugene M. Whitacre; Kenneth R. Schaefer

[57] ABSTRACT

A feedback stabilized differential signal amplifier exhibiting relatively good linearity which avoids the need for a signal bypass capacitor in the feedback circuit. Feedback is provided by means of a current repeater direct current coupled between an output terminal and the emitters of a pair of differentially coupled amplifier transistors. Bias current is provided to the amplifier transistors by a separate current control transistor. High frequency rolloff is determined by a capacitor coupled to one of the amplifier transistors in a Miller feedback arrangement. The circuit is suitable for construction in monolithic integrated circuit form.

8 Claims, 1 Drawing Figure

FEEDBACK AMPLIFIER

Figure 1:
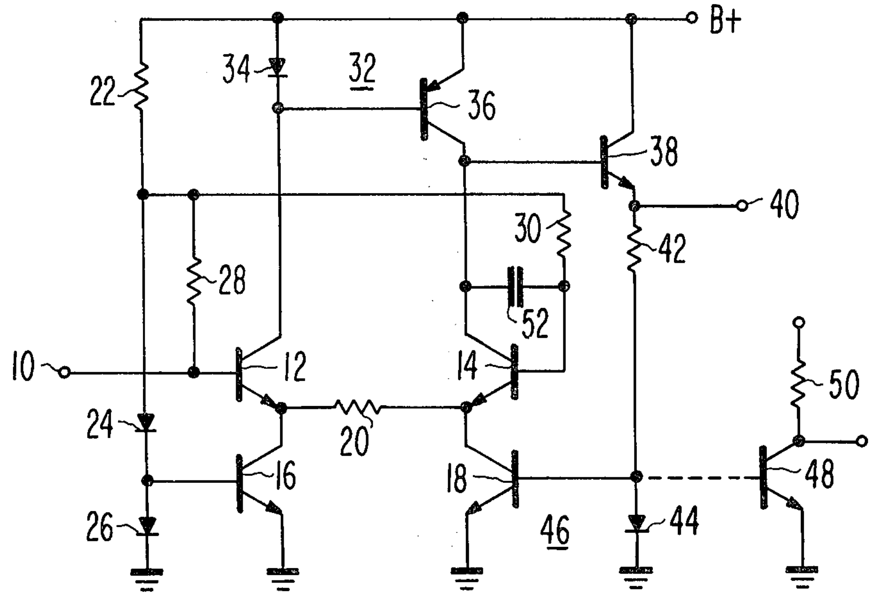

This invention relates to feedback stabilized signal amplification circuits and, in particular, to such an amplifier which is suitable for use as an audio signal amplifier constructed in monolithic integrated circuit form.

In the design of electronic amplifier circuits, and particularly where such circuits are constructed in monolithic integrated form, it is advantageous to use differential amplifier arrangements. Differential amplifiers provide a large number of advantages including the use of a relatively few capacitors, the avoidance in large part of the use of large value resistors, dependence of gain on resistor ratios rather than absolute values, wide frequency operating range including low audio frequencies, push-pull or single-ended inputs and/or outputs and stable operation.

In connection with the stability characteristics of such amplifiers, signal gain stability and quiescent or DC level stability are generally desirable. Negative feedback is frequently employed to obtain such results. In the interests of economy, it is desirable to be able to provide such feedback with the use of a minimum number of bypass capacitors. In the context of integrated circuits, it is also desirable to minimize the number of terminals to which external components such as bypass capacitors need be connected.

Where the input stage of the amplifier is in the differential form, it is common to apply signal to one side of the differential configuration and feedback to the other. In another arrangement such as is shown in U.S. Pat. No. 3,434,069 granted Mar. 18, 1969 to Robert L. Jones, the customary constant current source (or sink) transistor associated with the differential amplifier transistor is replaced by a "$\pi$" network including a resistor connected between the emitters of the differential transistors and a further pair of current generator transistors each coupled between the emitter of one of the differential transistors and a reference voltage point. The current generator transistors are driven by a single-ended-voltage-to-differential-current feedback stage to provide the desired stabilizing negative feedback from the amplifier output. While such a configuration provides a number of desirable attributes, it involves the use of positive and negative voltage supplies, a condition which is undesirable in many environments, including monolithic integrated circuits. Furthermore, the feedback network requires the use of a considerable number of components, both active and passive, to convert the single-ended output voltage variations to differential feedback current variations.

In accordance with the present invention, a feedback stabilized amplifier is provided which comprises a differential signal amplifier having at least first and second signal amplifier transistors and a signal input terminal coupled to one of the transistors. An output terminal is direct current coupled to the differential amplifier. A first current control transistor is coupled to the differential amplifier to supply bias current to the first and second amplifier transistors. A current repeater is coupled between the output terminal and the amplifier transistor and comprises a second current control transistor, an input terminal coupled to the output terminal and a feedback current supply terminal coupled to the first and second amplifier transistors for providing negative feedback.

Figure 2:
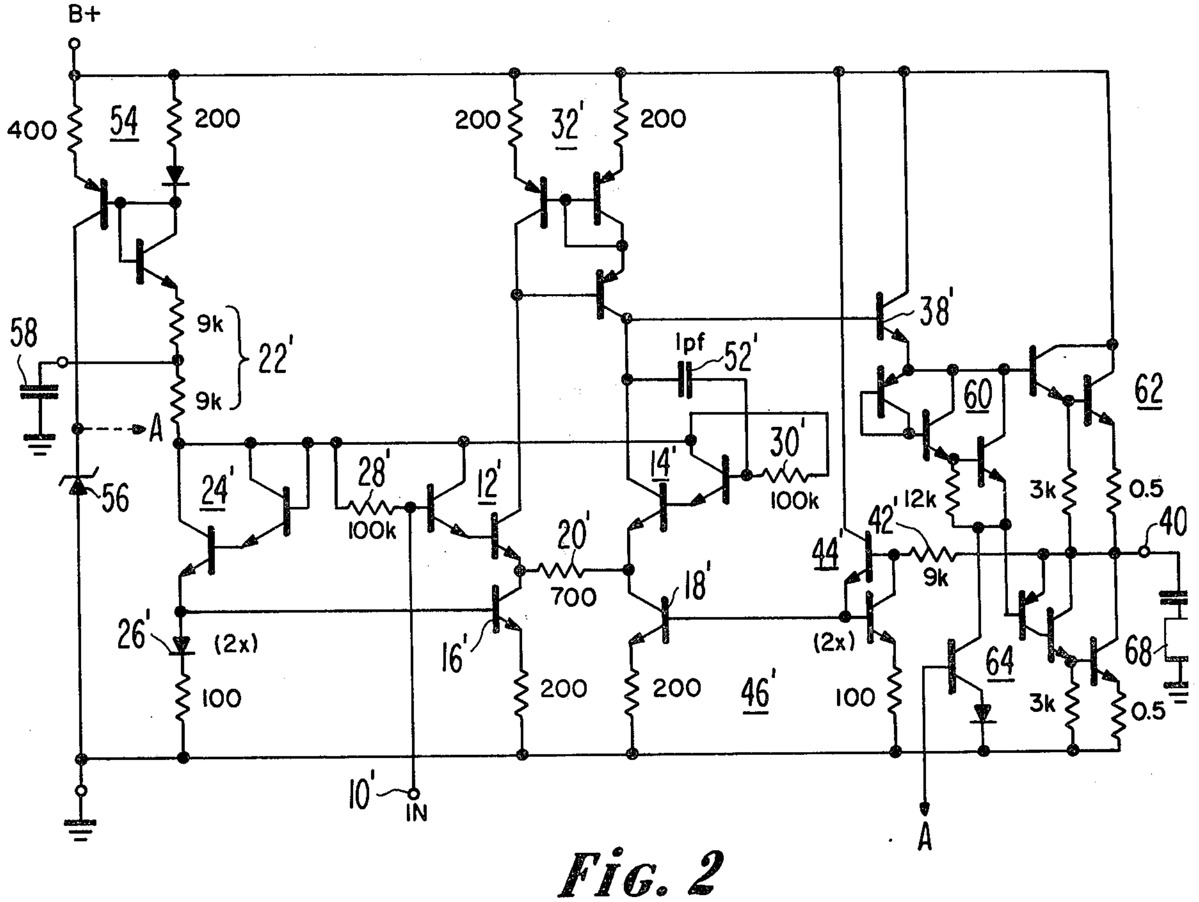

The novel features of the present invention are set forth with particularity in the appended claims. The invention itself, however, both as to its organization and method of operation, as well as additional objects and advantages, will best be understood from the following description when read in conjunction with the accompanying drawing in which:

FIG. 1 is a schematic circuit diagram of a simplified differential amplifier embodying the present invention, and FIG. 2 is a detailed schematic circuit diagram of an amplifier suitable for construction in integrated circuit form which embodies the present invention.

Referring to FIG. 1, input signals to be amplified are coupled via an input terminal 10 to the base electrode of a first transistor 12 of a pair of differentially coupled amplifier transistors 12 and 14. Operating current is coupled to the emitters of transistors 12 and 14 by means of a combination of first and second current control transistors 16 and 18 and a feedback resistor 20. Resistor 20 is direct current coupled between the emitters of transistors 12 and 14 (as well as between the collectors of transistors 16 and 18). Quiescent operating current for transistors 12 and 14 is determined by means of the series combination of a resistor 22 and diodes (semiconductor junctions) 24 and 26 coupled between two terminals (B+ and ground) of a source of direct operating voltage. Diode 26 is direct current coupled between the base and emitter of transistor 16 to provide a current repeater which produces a collector current in transistor 16 proportional to the current in diode 26. Operating bias for the bases of transistors 12 and 14 is supplied from the junction of resistor 22 and diode 24 via relatively large de-coupling resistors 28 and 30, respectively.

Collector currents of transistors 12 and 14 are combined to provide a single-ended output by means of a current repeater 32 illustrated as comprising a diode 34 and a transistor 36, the devices 34 and 36 having similar geometries and being in a common thermal environment so as to provide, for example, a replica of the collector current of transistor 12 at the collector of transistor 36.

A single-ended output difference current is coupled from the joined collectors of transistors 14 and 36 to the base of a voltage follower output transistor 38, the emitter of which is coupled to an output terminal 40. A load resistor 42 is coupled between output terminal 40 and the reference voltage point (ground) by means of a diode 44 which, in conjunction with current control transistor 18, provides a feedback current repeater 46.

An inverted output signal may be provided, for example, by coupling the base-emitter circuit of a further transistor 48 across diode 44 and coupling a load 50 to the collector of transistor 48. In that case, the geometries of transistor 48 and diode 44 would be suitably proportional to provide the desired current gain.

The frequency response of the amplifier is determined principally by a capacitor 52 coupled in a capacitance multiplying feedback path between the collector and base of transistor 14. The effective value of capacitor 52 in conjunction with associated resistance (e.g., resistor 30) provides an appropriate frequency roll-off according to the intended use of the amplifier (e.g., in the upper portion of the audio frequency spectrum where audio use is contemplated). In the integrated circuit environment, the current repeater 46, shown as employing NPN devices which exhibit a relatively wideband frequency response, does not affect the frequency response of the overall circuit.

In the operation of the circuit of FIG. 1, the quiescent collector current of control transistor 16 is determined according to the expression $$I_{16} = \frac{B+ - 2V_{BE}}{R_{22}}$$

where $V_{BE}$ is the voltage across each of diodes 24 and 26 and typically is of the order of 0.7 volts.

Ignoring for the moment the transistors 14 and 18 and assuming the current gain ($\beta$) of each of transistors 12 and 16 is relatively high and that current repeater 32 provides unity gain, the collector current of transistor 16 will be reflected by means of transistor 12, diode 34 and transistor 36 at the collector of transistor 36. The resulting drive to follower transistor 38 will produce a quiescent voltage at output terminal 40 which, in turn, will be converted to a current in diode 44 and resistor 42.

The resulting current is diode 44 may be expressed in terms of the quiescent output voltage $V_{OQ}$ at terminal 40 as follows:

$$I_{44} = \frac{V_{OQ} - V_{BE}}{R_{42}}$$

Neglecting for the moment the connection provided by resistor 20, where diode 44 and transistor 18 have equal geometries so that current repeater 46 provides unity current gain, the collector current of transistor 14 will also be substantially equal to $I_{44}$ (i.e., $I_{18} = I_{44}$).

In an amplifier of this type, it is advantageous if the voltage $V_{OQ}$ is approximately equal to one-half the B+ supply voltage, thereby providing a substantially symmetrical maximum voltage output swing at terminal 40 in response to applied signals. Substituting the values B+/2 for $V_{OQ}$ and $I_{18}$ for $I_{44}$ in the above expression and further setting $I_{16}$ equal to $I_{18}$ in the earlier expression, it can be seen that the desired $V_{OQ}$ can be obtained by selecting $R_{22}$ equal to twice the value of $R_{42}$. This quiescent condition will be maintained by virtue of the negative feedback provided via current repeater 46.

The quiescent current in resistor 20 will also be substantially zero as was assumed in considering the two halves of the circuit separately.

When input signals are supplied to terminal 10, the currents in transistor 12, diode 34 and transistor 36 will vary accordingly. The input signal variations are also coupled via resistor 20 to the emitter of transistor 14 to produce a change of opposite sense in the collector current of transistor 14. A resulting voltage variation at output terminal 40, in phase with the signal supplied at terminal 10, causes a change in the feedback current supplied by current repeater 46 of a sense to tend to rebalance the currents in transistors 12 and 14 (i.e., negative signal feedback is provided).

The signal voltage gain of the amplifier is determined principally by the ratio of resistors 42 and 20 and the current gain of repeater 46 (suggested above to be unity).

Amplifiers of this type have been observed to produce relatively low distortion which may be attributed, at least in part, to the fact that the current levels in transistors 12 and 14 tend to follow each other more than in conventional differential amplifiers.

Referring to FIG. 2, circuit elements performing similar functions to elements shown in FIG. 1 are indicated by the same reference numerals as are utilized in FIG. 1 followed by a prime (′) symbol.

In FIG. 2, input signals are supplied via terminal 10′ to the base of a pair of Darlington coupled transistors 12′ which form one side of a differential amplifier, the other side being provided by Darlington coupled transistors 14′. Operating bias is supplied by means of a series connected arrangement of semiconductor junctions and resistors coupled between the operating voltage supply terminals (B+ and ground). The semiconductor junctions typically are provided by means of transistors having their collector and base electrodes shorted together. The base-to-emitter voltage drops of Darlington arrangements 12′ and 14′ are simulated by the equivalent diode-connected transistors 24′.

A pair of substantially equal resistors 22′ principally determines the current level in the biasing arrangement as a function of the level of the applied operating voltage (B+ approximately +16 to +40 volts). A ripple rejection capacitor 58 is coupled to a mid-point of resistors 22′. A regulated voltage supply is also provided by means of a current source 54 coupled to an avalanche (zener) diode 56.

Degeneration resistors of the order of 100 to 400 ohms are associated with the current repeaters 32′, 46′, the current source 54 and the current control transistors 16′ and 18′ to improve the matching of currents where desired.

The current repeater 32′ is of a different form as compared to repeater 12 of FIG. 1 but provides the same function with a higher impedance as is known. Repeater 46′ is also of a modified form as compared to repeater 46 but is arranged to provide a current gain (loss) of one-half by virtue of including a transistor (not numbered) having a base-emitter area twice (2X) that of transistor 18′ with which it is associated. Similarly, diode 26′ is related in area to transistor 16′ by a factor of two. These area ratios are selected to permit the use of higher current levels (and hence smaller resistor values) in the bias string as compared to the desired currents in transistors 16′ and 18′. Such configurations are particularly desirable where the illustrated circuit is constructed in monolithic integrated form, since in that case, the smaller resistor values result in an economy of area on the integrated circuit chip.

Additional modifications to the circuit of FIG. 2 include the addition of a quasi-complementary power amplifier output stage 62 including a temperature compensated, crossover distortion reducing biasing network 60 and a current supply transistor 64. As is known, output stage 62 provides substantially unity voltage gain. Transistor 64 may be supplied with an appropriate base bias to provide substantially constant collector output current by coupling terminal A to the similarly labelled terminal adjacent regulating diode 56 by, for example, an appropriate diode-resistor combination of the type shown, for example, in U.S. Pat. No. 3,534,245 of A. L. R. Limberg.

An appropriate load circuit such as a loudspeaker 68 is coupled to terminal 40′ to utilize the amplified signals produced there. With the illustrated circuit component values constructed on an integrated circuit, a speaker having a nominal impednace in the range of 8 to 32 ohms may be employed. Audio output power of the order of 4 watts may be obtained with the illustrated configuration. An associated voltage gain of the order of 35 db is provided by the arrangement. It should be noted that no external bypass capacitors are associated with the feedback circuitry.

While the invention has been illustrated in terms of certain preferred embodiments, it should be recognized that various modifications within the skill of the art may be made without departing from the scope of the invention.

For example, different biasing schemes may be provided. Further or different amplification stages may be employed. A modified quiescent operating voltage at other than approximately one-half the operating supply voltage may be provided by appropriate selection of the noted resistor values. The gain of the amplifier may be changed by appropriate modification, for example, of resistor 20. Other modifications also suitably may be made.

What is claimed is:

1. A feedback stabilized amplifier comprising:

a differential signal amplifier having at least first and second signal amplifier transistors and a signal input terminal coupled to one of said transistors, a first current control transistor coupled to said differential signal amplifier for supplying bias current to said first and second amplifier transistors, a single-ended output terminal direct current coupled to said differential amplifier, a first resistance having a first terminal direct current coupled to said output terminal and further having a second terminal, and current repeater means exclusive of said first current control transistor for providing negative feedback to said amplifier, said current repeater means being directly connected to said second terminal with at least one semiconductor junction direct current coupled between said second terminal of said first resistance and a point of reference potential, said current repeater means further having a second control transistor including a base-emitter junction coupled across said semiconductor junction and a collector electrode direct current coupled to the other of said first and second amplifier transistors for producing a single-ended current output proportional to feedback current produced in said first resistance.

2. A feedback stabilized amplifier according to claim 1 wherein:

said current output produced at said collector electrode of said second control transistor includes direct current and signal responsive components.

3. A feedback stabilized amplifier according to claim 1 wherein:

each of said signal amplifier transistors includes base, emitter and collector electrodes, said signal input terminal is coupled to one of said base electrodes and said emitter electrodes are direct current coupled to each other, and each of said current control transistors include base, emitter and collector electrodes, said collector electrodes of said current control transistors being direct current coupled to said emitter electrodes of said signal amplifier transistors.

4. A feedback stabilized amplifier according to claim 3 wherein:

said emitter electrodes of said amplifier transistors are each directly connected to a collector electrode of a corresponding one of said control transistors and are direct current coupled to each other by a second resistance.

5. A feedback stabilized amplifier according to claim 1 and further comprising:

a source of bias current including a series combination of a series resistance and at least one semiconductor junction, said last-named junction being coupled across a base-emitter junction of said first current control transistor, said first and series resistances being proportional to provide a predetermined quiescent voltage condition at said output terminal.

6. A feedback stabilized amplifier according to claim 5 wherein:

each of said signal amplifier transistors includes base, emitter and collector electrodes, said emitter electrodes are direct current coupled to each other by a second resistance, and each of said current control transistors include base, emitter and collector electrodes, said collector electrodes of said current control transistors are directly connected to said emitter electrodes of said amplifier transistors.

7. A feedback stabilized amplifier according to claim 6 wherein:

a capacitance is coupled to said collector electrode of said second amplifier transistor to provide a predetermined frequency response characteristic for said amplifier.

8. A feedback stabilized amplifier according to claim 7 and further comprising:

second current repeater means coupled to said collector electrodes of said amplifier transistor for providing a single-ended output signal, and said signal input terminal is coupled to said base electrode of said first amplifier transistor.

* * * * *